United States Patent [19]

Takenaka

[11] Patent Number: 5,428,563
[45] Date of Patent: Jun. 27, 1995

[54] FUNCTION GENERATOR WHOSE OUTPUT ATTAINS TO DESIRED VALUE AT DESIGNATED TIME

[75] Inventor: Toru Takenaka, Saitama, Japan

[73] Assignee: Honda Giken Kogyo Kabushiki Kaisha, Tokyo, Japan

[21] Appl. No.: 65,485

[22] Filed: May 20, 1993

[30] Foreign Application Priority Data

May 22, 1992 [JP] Japan .................................. 4-155919

[51] Int. Cl.$^6$ ..................... G06G 7/16; G06G 7/02; G06F 15/31
[52] U.S. Cl. ................. 364/851; 364/724.01; 364/825
[58] Field of Search ................ 364/851, 724.01, 825

[56] References Cited

U.S. PATENT DOCUMENTS

| | | | |
|---|---|---|---|
| 5,050,118 | 9/1991 | Inoue et al. | 364/724.01 |
| 5,073,748 | 12/1991 | Boehm . | |
| 5,150,317 | 9/1992 | Countryman | 364/724.01 |

FOREIGN PATENT DOCUMENTS

| | | |
|---|---|---|
| 419705 | 4/1991 | European Pat. Off. . |
| 56-44451 | 10/1981 | Japan . |
| 3-245201 | 10/1991 | Japan . |

OTHER PUBLICATIONS

Martin, "Simulation of Function with Variable Poles", Electronics Letters, 27th Dec. 1968 vol. 4 No. 26, pp. 594–595.

Edelston, "Tunable Filter Designs Simplify Real-Time Digital Rate of Change Estimation", Control Engineering, Sep., No. 9, St. Pontiac, Ill., U.S.A., 1983, pp. 161–166.

B. P. Lathi, *Signals and Systems* (Berkeley–Cambridge 1987), pp. 376–415.

R. A. Roberts and C. T. Mullis, *Digital Signal Processing* (Addison–Wesley 1987), pp. 173–471.

English language Abstract of JP 61042008 (publication date 28 Feb. 1986).

*Primary Examiner*—Tan V. Mai
*Attorney, Agent, or Firm*—Lyon & Lyon

[57] ABSTRACT

A function generator whose output attains to a desired value at a designated time and in the course of attainment, the desired value and/or designated time can be varied as desired. Therefore, the function generator is most suitable for generating a free leg's trajectory of a biped robot, since the free leg must be landed at a scheduled time and its trajectory may be varied midway in response to a walking condition. The function generator is typically constituted by a digital filter. More specifically, it is constituted by an a recursive digital filter at its initial state and its pole location of a transfer function describing the operation of the filter is varied in the course of attainment to the designated time such that the recursive filter is switched to a non-recursive filter.

46 Claims, 19 Drawing Sheets

Geometric model of biped robot

FUNCTION GENERATOR WHOSE OUTPUT ATTAINS TO DESIRED VALUE AT DESIGNATED TIME

BACKGROUND OF THE INVENTION

1. Field of the Invention

This invention relates to a function generator, more particularly to a function generator whose output attains or reaches to a desired value at a designed definite time and in which, the desired value and/or the time can be varied in the course of attainment as desired.

2. Description of the Prior Art

Function generators which generate outputs of prescribed functions in response to inputs have been well-known. One example is taught by Japanese Patent Publication No. 56(1981)-44451. The function generator taught there includes an integrator and generates an output of a ramp function varying linearly with respect to time.

It should be noted, however, that the term "function generator" is used in this specification to not only mean the so-called function generator such as taught by the above reference, but also to include any computing means which generates a value a specific function as desired. In that broader sense, a technique proposed by Japanese Laid-open Patent Publication No. 3(1991)-245201 can further be cited as a prior art. This discloses a control system for a robot or the like involving some limitations .such as a voltage to be supplied to the robot's motor being restricted to a predetermined value. The system generates a control input which enables an output (controlled variable) to be in coincident with a desired value within a possible shortest time.

Aside from the above, when generating a trajectory of a robot such as a trajectory of a free (swing) leg of a legged mobile robot, the trajectory has to be generated taking into account the restriction on the free (swing) leg's footfall time. Because of this, there is a need for a function generator able to produce an output which varies smoothly from an initial value to a desired value and to complete the transition to the desired value at a designated definite attainment time. This can not be satisfied by the techniques proposed in the aforesaid references. In addition, there is a need for a function generator with this capability which is further capable of changing the desired value or the designated attainment time in the course of the transition.

If one attempts to constitute the function generator using a filter, particularly using one of the various types of digital filters that have become available in recent years, one has a choice between the two general categories of digital filters: the FIR or non-recursive digital filter and the IIR or recursive digital filter. Each of these has its drawbacks. Although the FIR digital filter has a finite settling time and can smoothly correct its output when the desired value is changed in the course of attainment, it does not allow the settling time (designated attainment time) to be changed. Moreover, when designed to have a long settling time, the filter involves a high-order linear difference equations with constant difference quotients which greatly increase the amount of computation. Although the IIR digital filter can smoothly correct its output when the desired value is changed in the course of attainment and does not involve a large amount of computation, it does not allow the settling time to be changed and does not have a finite settling time. These same shortcomings are also encountered with the use of analogue filters. While it is conceivable not to use a filter but instead to use a polynomial expression for obtaining the desired output, this also runs into the problem high-volume computation and a very high degree of difficulty in changing the desired value or designated attainment time in the course of attainment.

SUMMARY OF THE INVENTION

An object of this invention is therefore to overcome the aforesaid disadvantages of the prior art by providing a function generator whose output attains at a designated definite time to a desired value or at least a value approximating the desired value and which enables the desired value and/or the designated attainment time to be changed in the course of attainment.

Another object of the invention is to provide a function generator whose output varies smoothly to a desired value or a value approximating the desired value, which is of a simple configuration, and achieves its output with a small amount of computation.

For realizing this object, the present invention provides a function generator whose output is a specific function of its input, wherein the improvement comprises, means for varying the characteristics of the function generator according to a remaining time up to a desired time such that reaches the just or around a desired value.

BRIEF DESCRIPTION OF THE DRAWINGS

The above and other objects and advantages of the invention will be more apparent from the following description and drawings, in which.

DETAILED DESCRIPTION OF THE PREFERRED EMBODIMENTS

Figure 1:
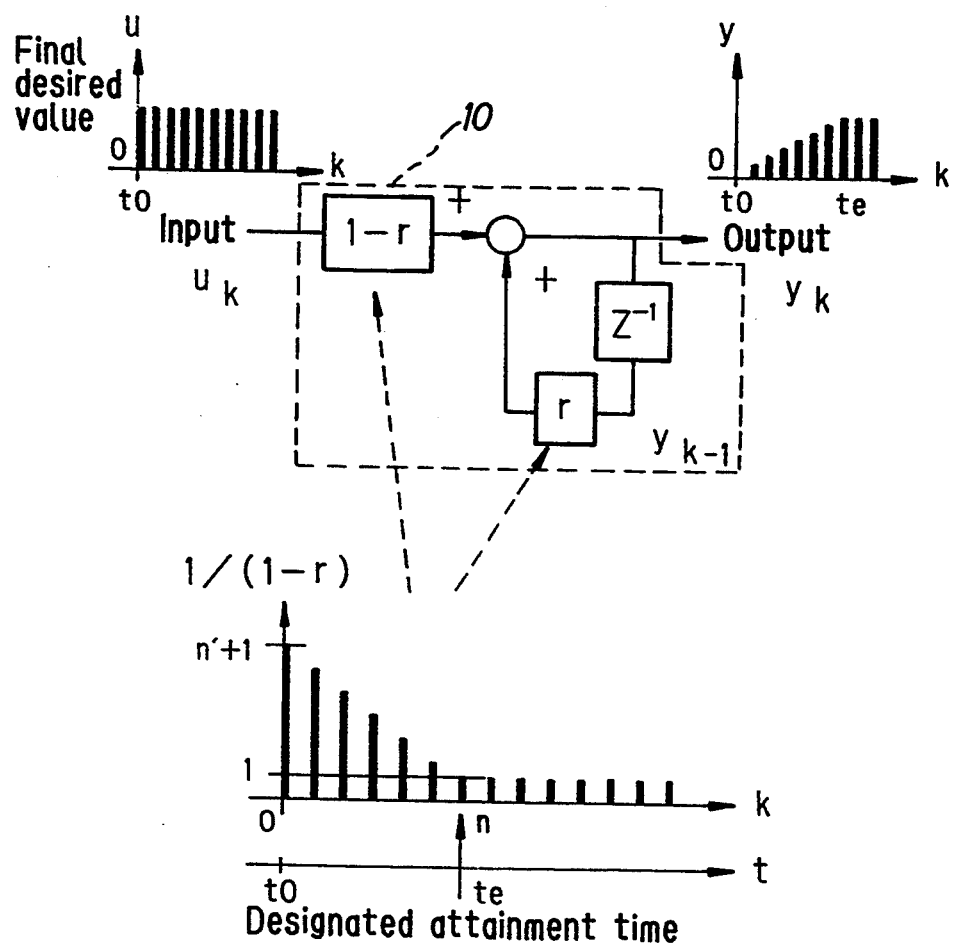
FIG. 1 is a block diagram showing a function generator according to a first embodiment of the invention.

FIG. 1 is a schematic view of the function generator enabling attainment (arrival) to a desired value at a designated definite time according to this invention. This figure focuses mainly on the input-output characteristics of the function generator. The function generator comprises a conventional IIR digital filter 10. As shown in FIG. 1, the digital filter 10 is applied with an input that immediately varies to a desired value from an initial time t0.

The configuration of FIG. 1 can be expressed as a difference equation as Eq. 1;

$$yk = r*yk-1 + (1-r)*uk \qquad \text{Eq. 1}$$

When this is z transformed, its transfer function will be expressed as Eq. 2;

$$H(z) = \frac{1-r}{1-rz^{-1}} \qquad \text{Eq. 2}$$

Where the pole on the z-plane is designated as r.

Figure 2:
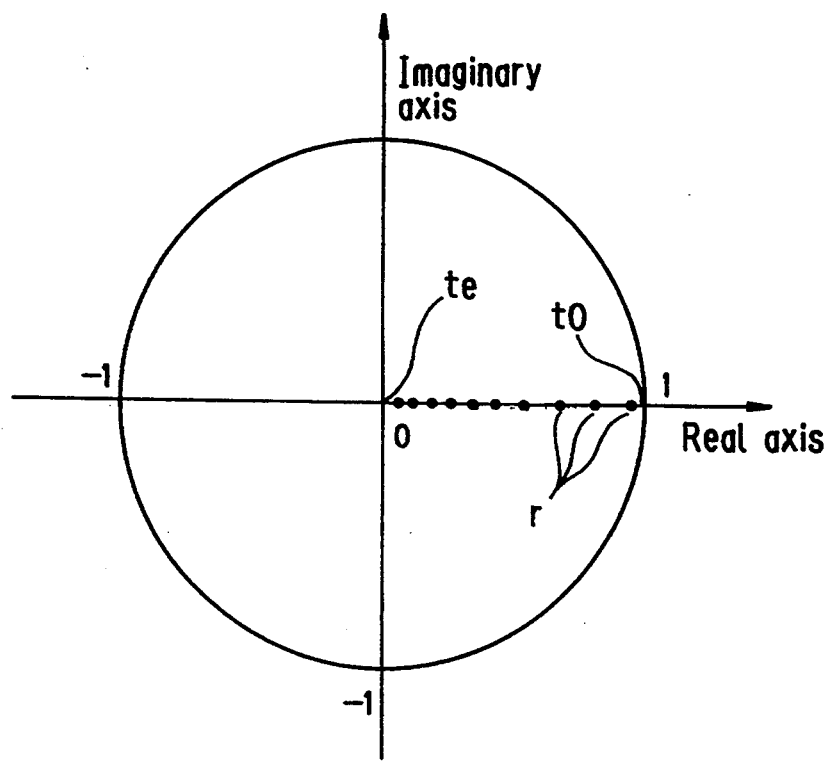
FIG. 2 is a view of a pole manipulation on a z-plane of a transfer function describing the operation of the function generator of FIG. 1.

The pole r has initial value slightly smaller than 1, decreases with increasing proximity to the designated attainment time te as shown in FIG. 2, and disappears at the designated attainment time te. There is no particular need for the values of r to decrease monotonously; it can be defined, for example, as shown by Eq. 3. The value of the pole is annihilated to achieve settling at the desired value at the designated attainment time.

$$\begin{cases} r = \dfrac{n' - \dfrac{n'}{n}k}{n' - \dfrac{n'}{n}k + 1} & (1 \le k \le n) \\ r = 0 & (k > n) \end{cases} \qquad \text{Eq. 3}$$

Figure 3A:
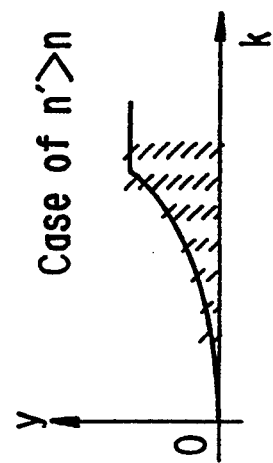
FIG. 3 is a graph explaining the characteristics of a coefficient used for the pole manipulation of FIG. 2.
Figure 3B:
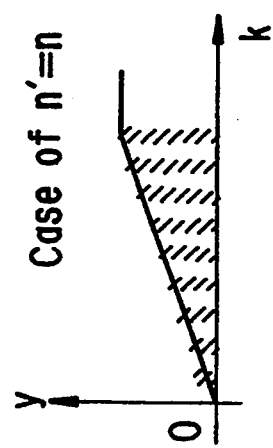
Figure 3C:
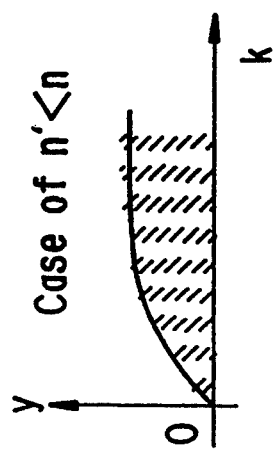

The symbol n in Eq. 3 designates the number of steps between the initial time t0 and the designated attainment time te, namely is equal to ((designated attainment time te − initial time t0)/sampling interval). The symbol n' designates a non-negative constant. As shown in FIG. 3, the output waveform can be varied by varying the magnitude of n'.

Figure 4:
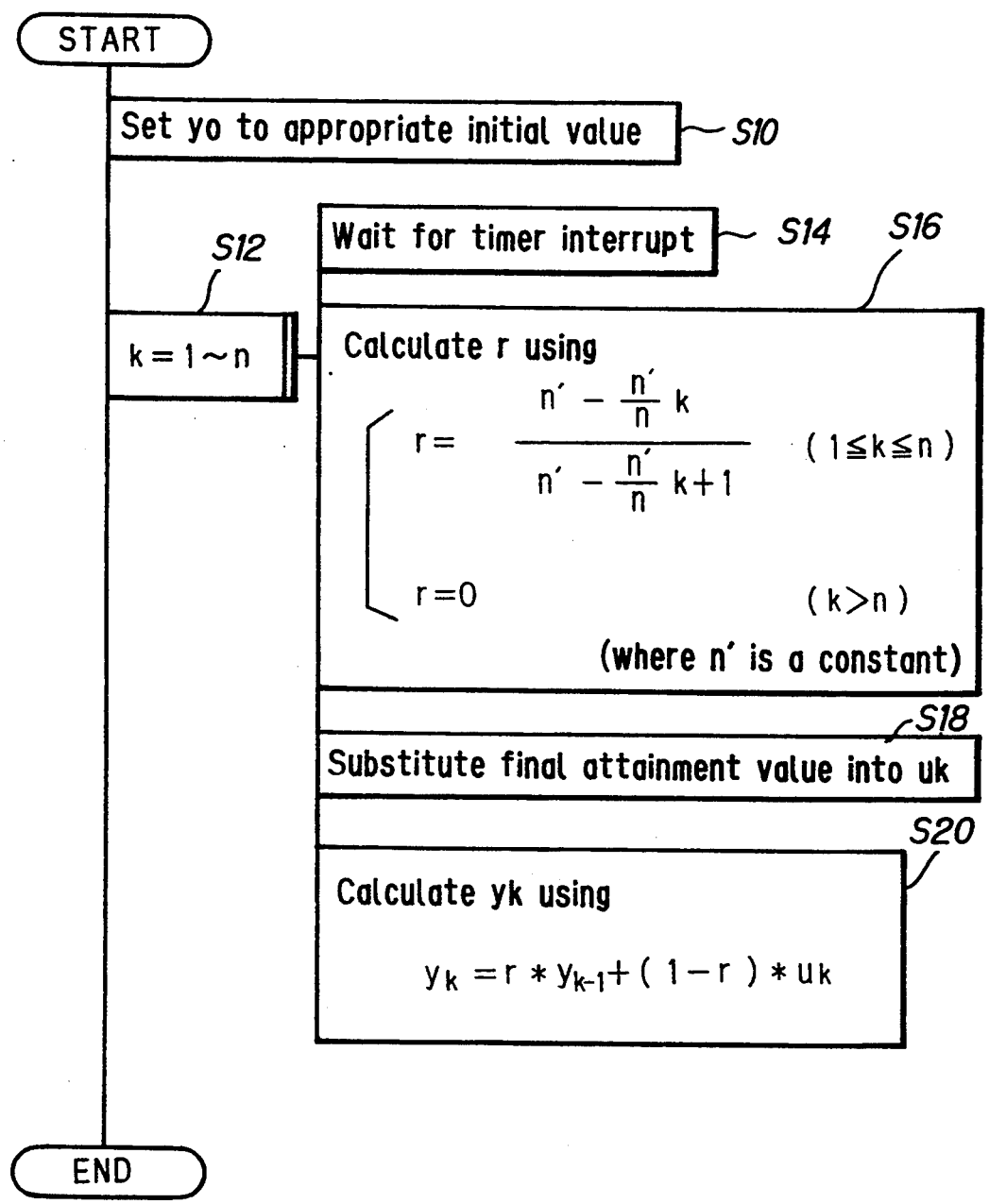
FIG. 4 is a flow chart explaining the operation of the function generator according to the first embodiment of the invention.

The foregoing will now be explained with reference to the PAD diagram (structural flow chart) of FIG. 4. First, in step S10, yo is set to an appropriate initial value. Control then passes to step S12 in which the value of k in Eq. 3 is raised in increments of one from 1 to n, each time repeating the operations of step S14 to S20. In step S14 control waits for a timer interrupt occurring once every sampling interval mentioned before, and when one occurs, passes to step S16 in which r in Eq. 3 is calculated, step S18 in which uk in Eq. 1 is replaced with the desired value (final attainment value), and to step S20 in which yk is calculated from the equation indicated (i.e. Eq. 1). These processing operations are repeated for each timer interrupt in step S14.

Figure 5:
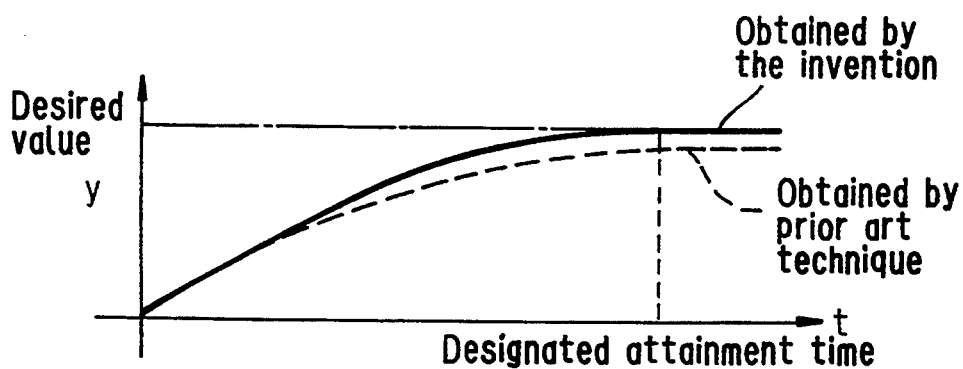
FIG. 5 is a waveform chart illustrating an output of the function generator of FIG. 1 in analogue form.

Since the value of pole r is varied from around 1 toward 0 so as to gradually decrease the value of $1/(1-r)$ with increasing proximity to the designated attainment time te (as shown at the bottom of FIG. 1), there is obtained a smooth waveform achieving perfect coincidence with the desired value (final attainment value) at the designated attainment time te (at nth step). An analogue representation of the waveform is shown in FIG. 5. In contrast to an output obtained by the prior art filter, which has difficulty achieving the desired value, the output of the function generator according to this invention achieves precise coincidence with the desired value at the scheduled time. Once coincidence is obtained at the designated attainment time, the output faithfully follows the input.

The foregoing can be said to amount to starting with an IIR filter and then switching midway to the characteristics of an FIR filter. As a result, the IIR filter's drawback of not settling within a finite time period and the FIR filter's drawback of involving large amounts of computation are eliminated, whereby settling within a finite time period becomes possible and the amount of computation is small even in cases where the number of steps between the initial time and the designated attainment time is large. Therefore, the amount of computation does not become large even if the desired value or the designated attainment time is changed midway. The making of such changes is thus facilitated. It is also a feature of the invented function generator that the output waveform is changed by the pole setting. Generally speaking, therefore, setting the pole small overall results in rapid approach to the vicinity of the desired value, followed by gradual settling to the desired value. On the other hand, setting the pole large overall results in slow approach to the vicinity of the desired value, followed by rapid settling to the desired value at the designated attainment time.

While the foregoing description focuses on the pole location, the important thing is that the upper limit frequency of the pass range of a low-pass filter be gradually raised with increasing proximity to the designated attainment time. It is also possible, therefore, to vary the zero point location. In the case of the FIR digital filter discussed later, for example, the pass band can be varied by varying the zero, point location. While the pole location was explained in terms of the z-plane, it can be conducted with respect to a complex number plane if an analogue filter is used.

Figure 6:
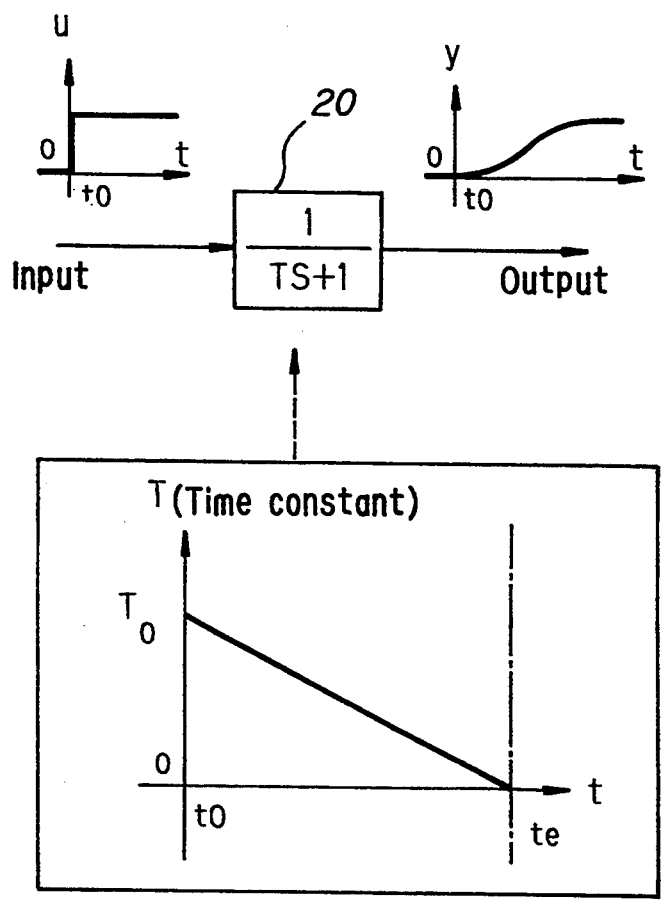
FIG. 6 is a block diagram showing a function generator according to a second embodiment of the invention in which the function generator uses a first-order lag filter.
Figure 7:
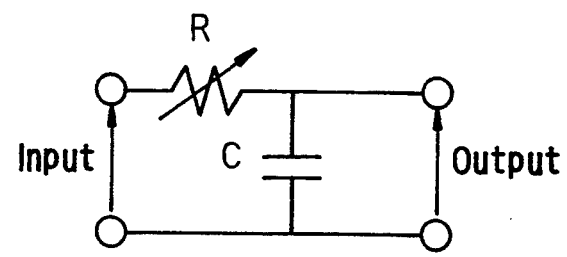
FIG. 7 is a circuit diagram showing the first-order lag filter of FIG. 6 constituted by analogue circuitry.
Figure 7:
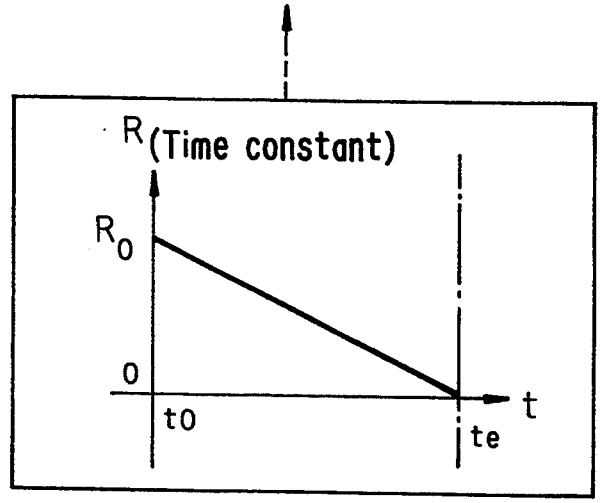

FIG. 6 shows a second embodiment of the invention. This embodiment is similar to the first except that the configuration uses a first-order lag filter 20 whose time constant T (i.e. the value of $(-1/\text{pole})$) is reduced over the course of time toward the designated attainment time te. FIG. 7 shows an example of the same constituted using analogue circuitry.

Figure 8:
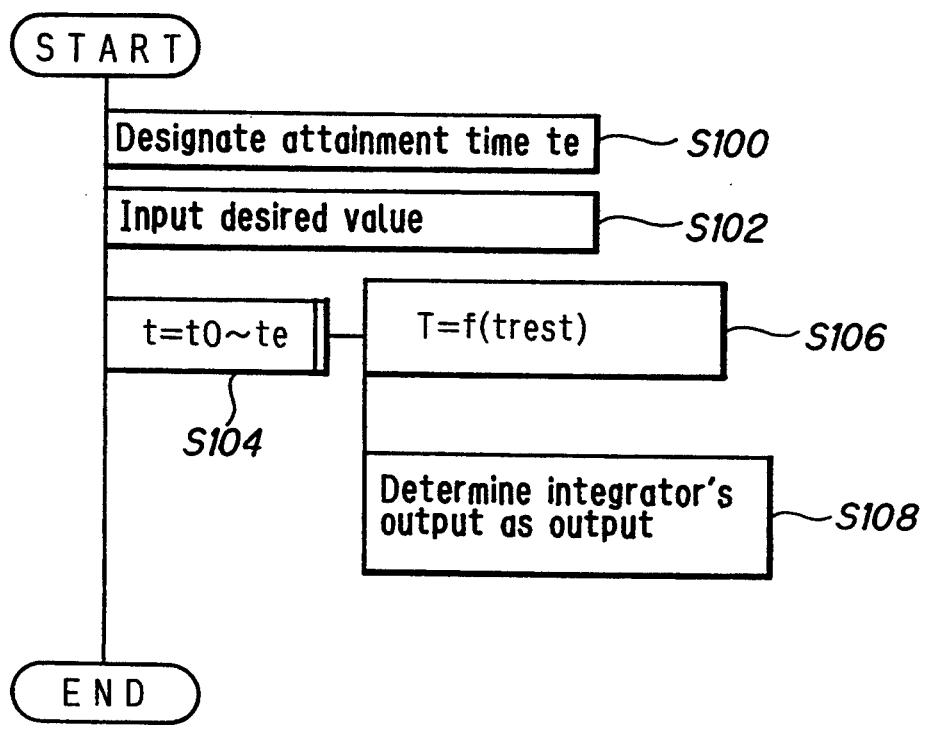
FIG. 8 is a flow chart showing the operation of the function generator according to the second embodiment of the invention.

The operation of the function generator according to the second embodiment will be explained with reference to the PAD diagram of FIG. 8. First, the attainment time te is designated in step S100, whereafter control passes to step S102 in which the filter 20 is input with a step input which immediately changes to the desired value at the initial step t0. Control then passes to, via step S104, to S106 in which the time constant T (or the value of resistance R in FIG. 7) of the filter 20 is gradually decreased with the passage of time from its initial value T0 (R0) at the initial time t0 to approximately 0 at the designated attainment time te (i.e. the absolute value of the pole is changed to very large negative values or $-\infty$.), and to step S108 in which the output of the final stage integrator is determined to be the output of the function generator.

Specifically, it suffices to predefine the relationship between time constant T of the filter and the remaining time trest up to the designated attainment time te. In other words, it suffices to define the time constant T of the filter as a function of the remaining time trest up to the designated attainment time, as shown by Eq. 4.

$$T = f(\text{trest}) \qquad \text{Eq. 4}$$

Provided, however, that f(trest) is the increase function of the remaining time trest in the vicinity of trest=0 and that, as shown by Eq. 5, for example, f(trest) is set to be greater than zero.

$$f(\text{trest}) = T0 * \text{trest}/(te - t0) \qquad \text{Eq. 5}$$

In this embodiment, since the pole is manipulated to have negative real value in the complex number plane if discussing this in the analogue circuitry of FIG. 7, when a step input is applied as in the case of the first embodiment, no overshooting occurs and there is obtained an output waveform which coincides with the desired value at the designated attainment time. Moreover, since as shown in the drawings the configuration is simple, the designated attainment time and desired value can be easily changed.

Figure 9:
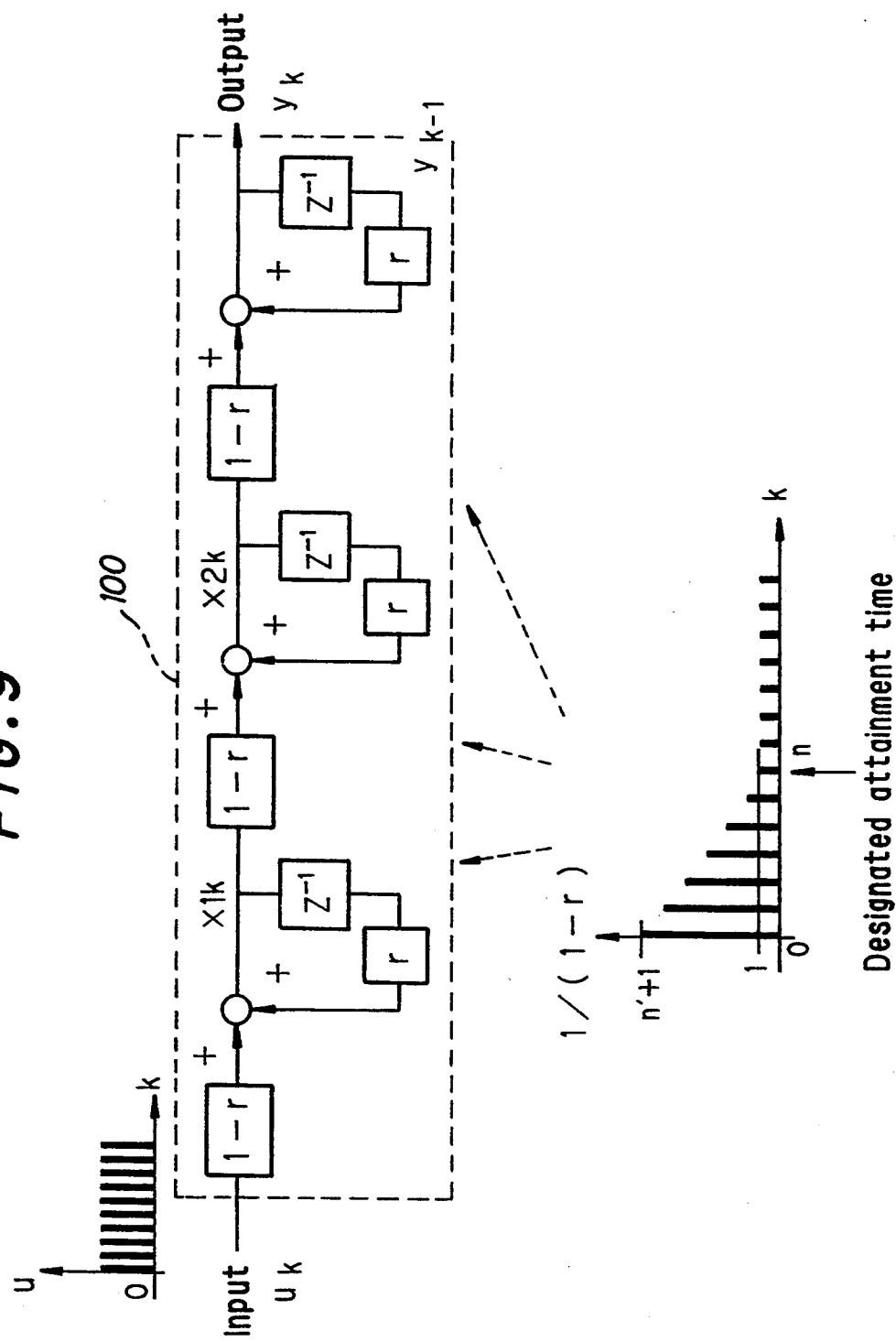
FIG. 9 is a block diagram showing a function generator according to a third embodiment of the invention.
Figure 10:
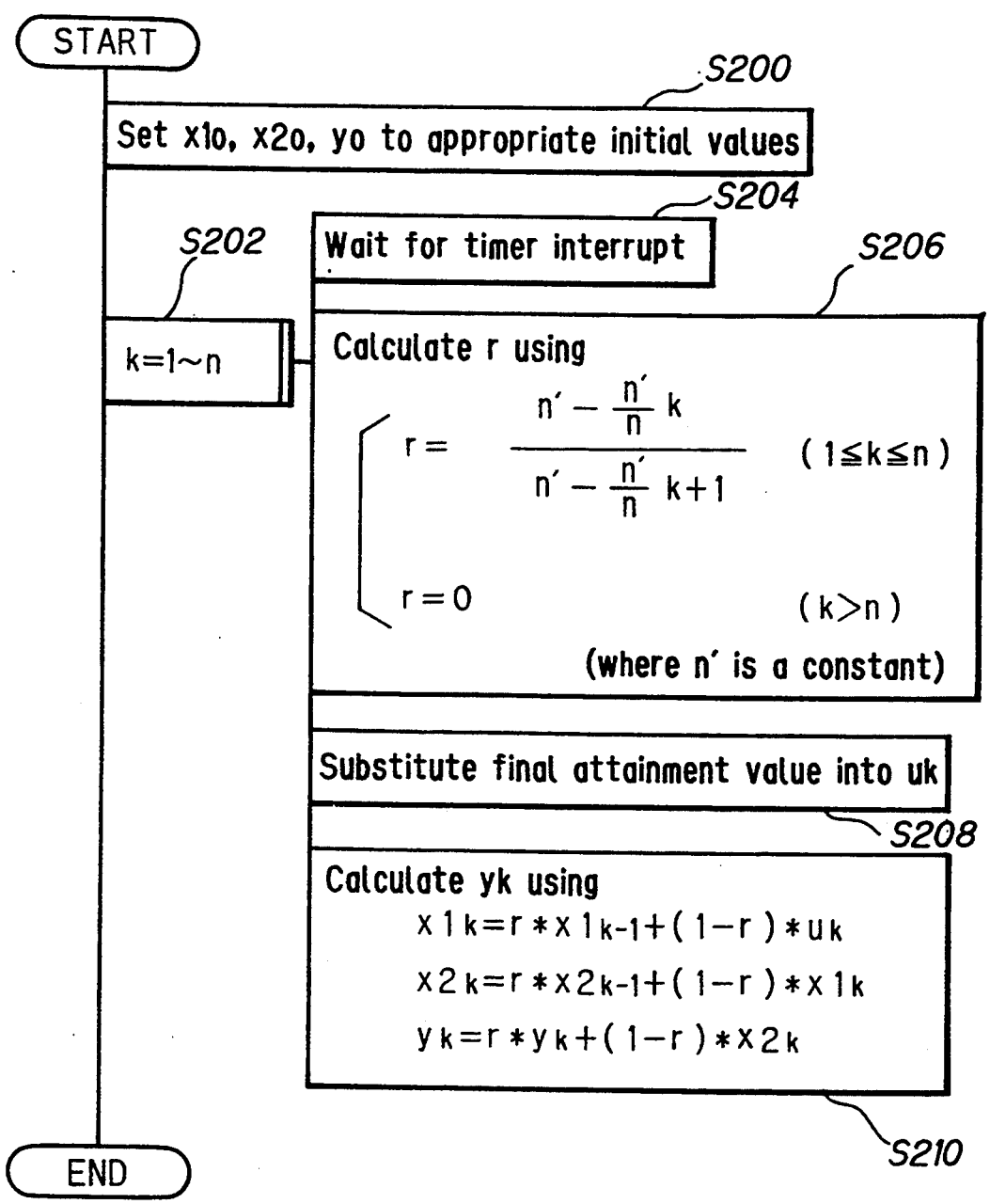
FIG. 10 is a flow chart showing the operation of the function generator according to the third embodiment of the invention.
Figure 11:
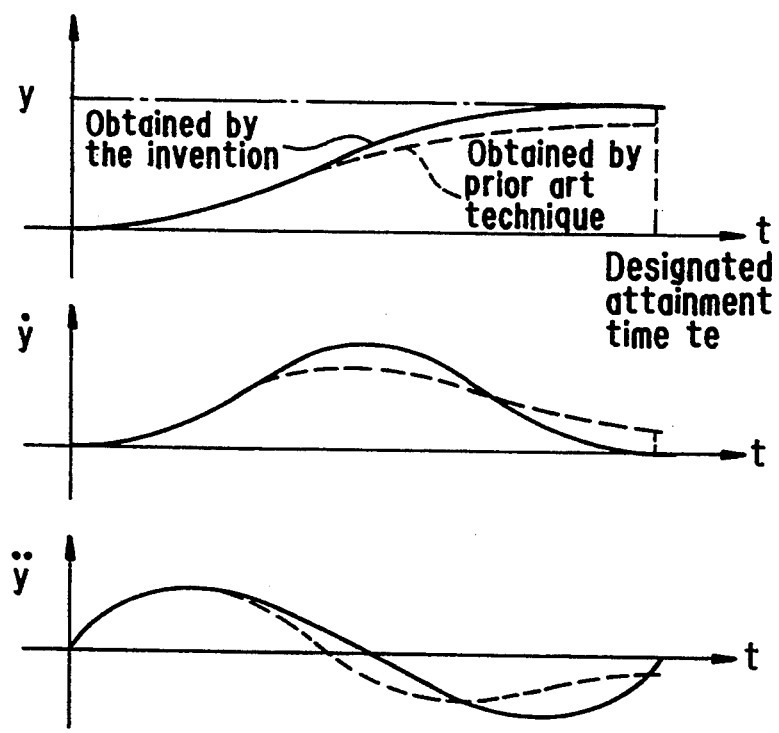
FIG. 11 is a waveform chart showing an output of the function generator according to the third embodiment of the invention.

FIG. 9 is an explanatory view, similar to FIG. 1, but showing a third embodiment of the invention. The function generator 100 of this embodiment is constituted of three function generators of the first embodiment connected in tandem. The poles r of the three IIR filters are manipulated similarly to in the first embodiment. The operation of the function generator according to the third embodiment is shown in a PAD diagram of FIG. 10. Aside from the fact that the coefficients are increased in steps S200 and S210, the flow chart of FIG. 10 is the same as the flow chart of FIG. 4 relating to the first embodiment. Since this third embodiment comprises three filters in tandem, even up to the second-order differential, it achieves smooth continuity and perfect coincidence with the desired value (zero in the case of the differential values) at the designated attainment time as seen from the analogue waveform representations shown in FIG. 11.

Figure 12:
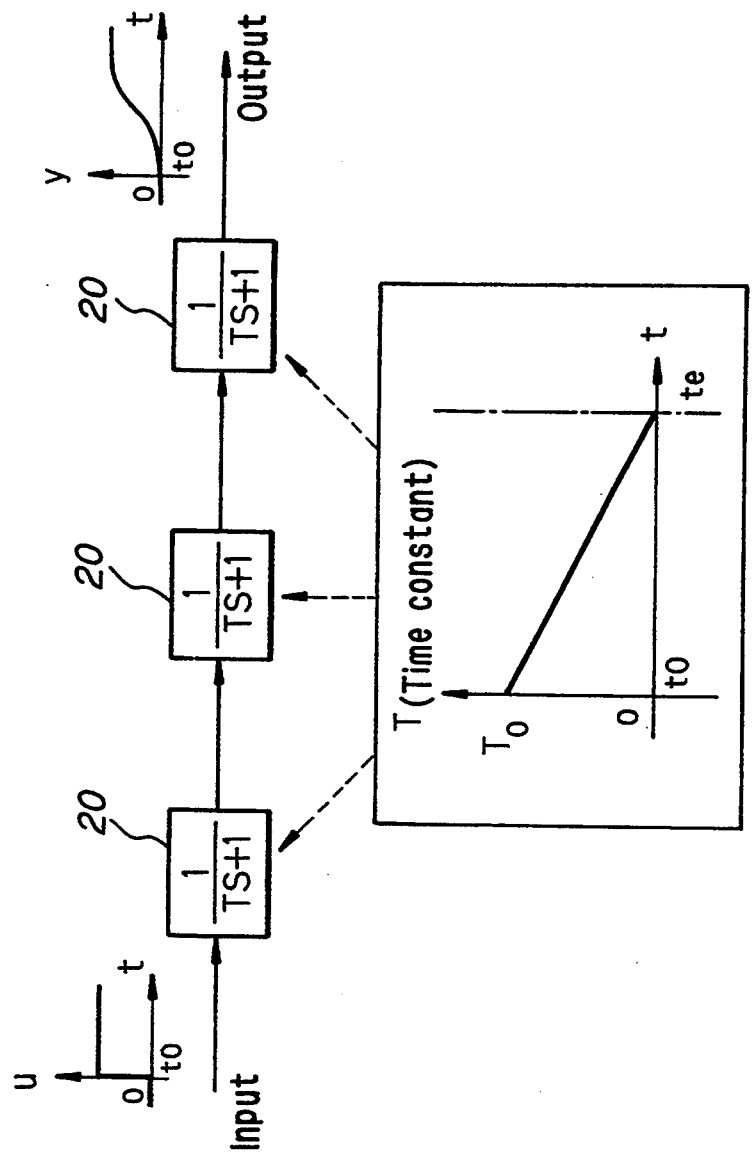
FIG. 12 is a block diagram showing a function generator according to a fourth embodiment of the invention.
Figure 13:
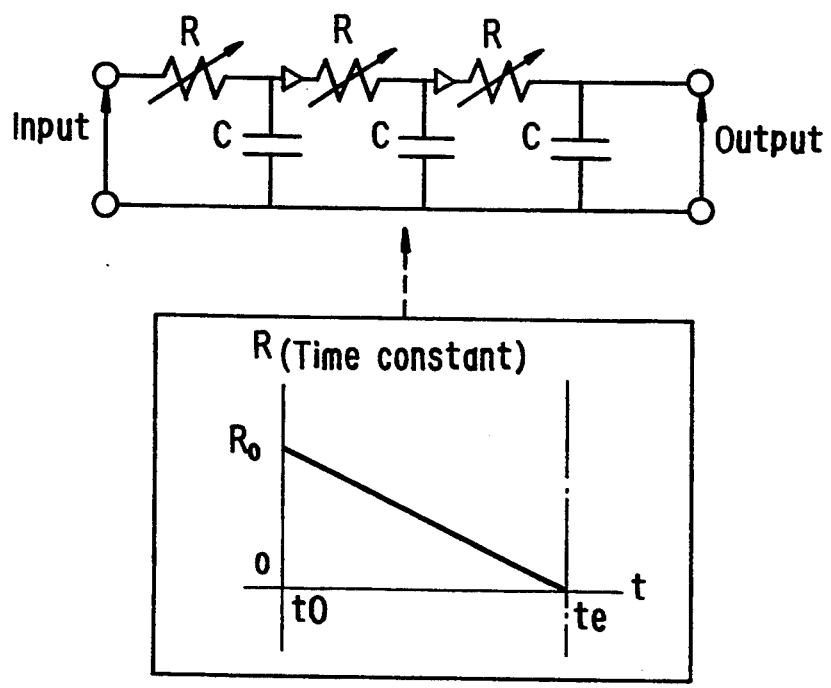
FIG. 13 is a circuit diagram showing the function generator of FIG. 12 constituted by analogue circuitry.

FIGS. 12 and 13 show a fourth embodiment of the invention. This embodiment is related to the second embodiment as the third embodiment is to the first, namely it is constituted by connecting three of the first-order lag filters of the second embodiment in tandem. In this embodiment, by setting the initial value T0 of the time constant of Eq. 5 to an appropriate value, it is possible to obtain waveforms whose increase/decrease velocities are symmetrical in the manner of FIG. 11.

The values of the three variable resistors are reduced at the same rate, for example, in accordance with the characteristics shown in FIG. 13. The effect is the same, as that of the third embodiment. As in the second embodiment, the output of the final stage integrator can be defined to be the output of the function generator. However, it is also possible to define the output in terms of the input and the outputs of the respective stages, by linearly combining the same, for example.

Figure 14:
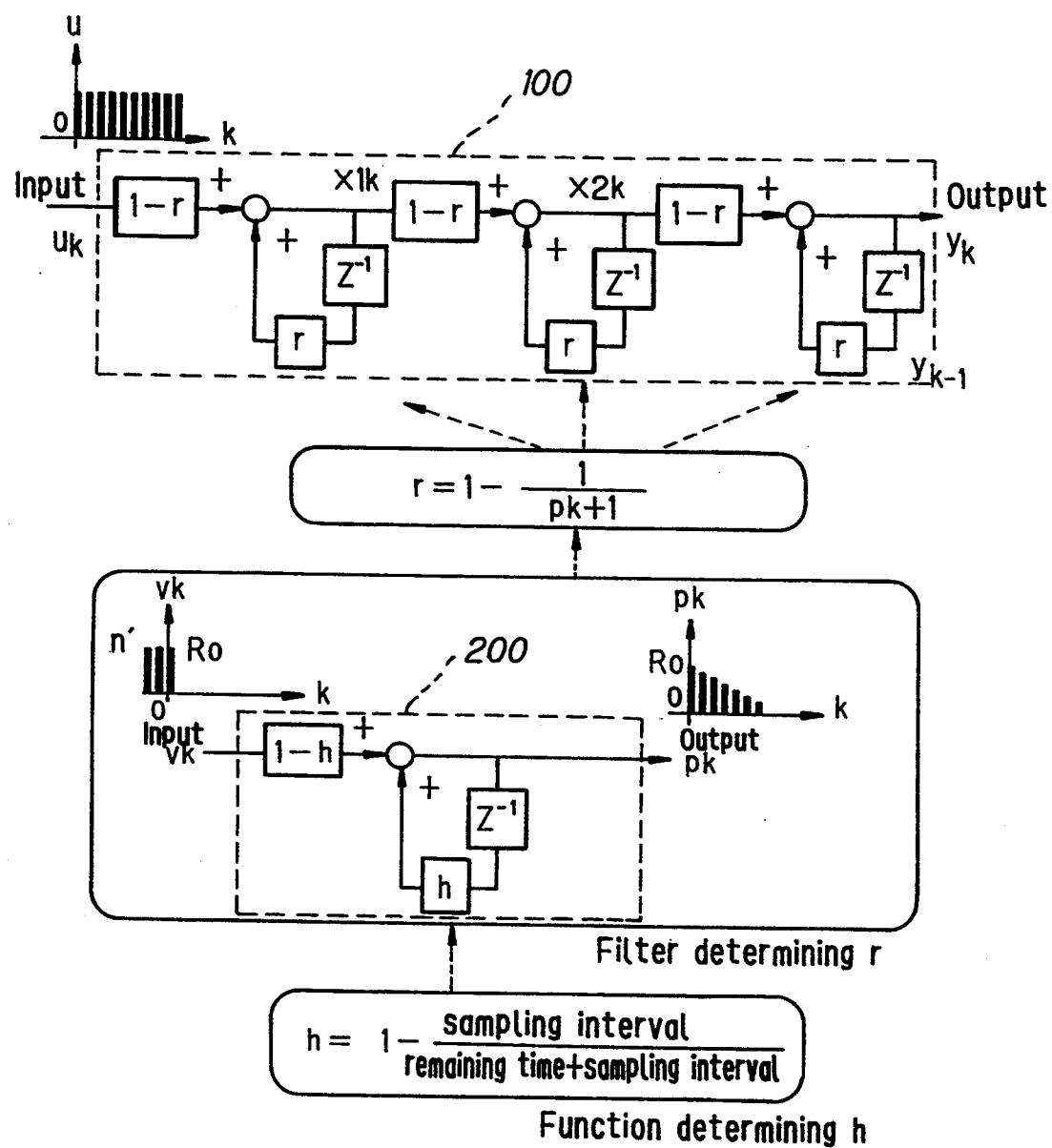
FIG. 14 is a block diagram showing a function generator according to a fifth embodiment of the invention.

FIG. 14 schematically illustrates a fifth embodiment of the invention, which is an improvement of the third embodiment. In this embodiment, the values of the poles r themselves are determined by the function generator according to the invention. More specifically, a second function generator 200 constituted as an IIR filter is similarly provided and the pole h of the second function generator 200 is varied to satisfy the characteristics shown at the bottom of FIG. 14, thereby determining the poles r of the first function generator 100.

This embodiment enables easier change of the designated attainment time than do the first embodiment. In the first embodiment, changing the designated attainment time requires modification of the r determining function shown at the bottom of FIG. 1 (9), ie. requires Eq. 3 to be rewritten. Otherwise the output waveform, particularly the second differential output waveform, does not change smoothly. In the present embodiment, on the other hand, the second function generator 200 whose pole h is given by Eq. 6 is input with a step input vk which has an initial value of n' and becomes zero from the first step, and poles r are determined from the resulting filter output pk as expressed as Eq. 7. When the designated attainment time is changed, therefore, the poles r change gradually notwithstanding that the pole h changes rapidly and discontinuously. Thus, the smoothness of the output waveform can be maintained and the designated attainment time can be simply and arbitrarily changed, without need to rewrite Eq. 3 or conduct other troublesome procedures.

$$h = 1 - \frac{\text{sample interval}}{\text{remaining time} + \text{sampling interval}} \qquad \text{Eq. 6}$$

$$r = 1 - \frac{1}{pk + 1} \qquad \text{Eq. 7}$$

Figure 15:
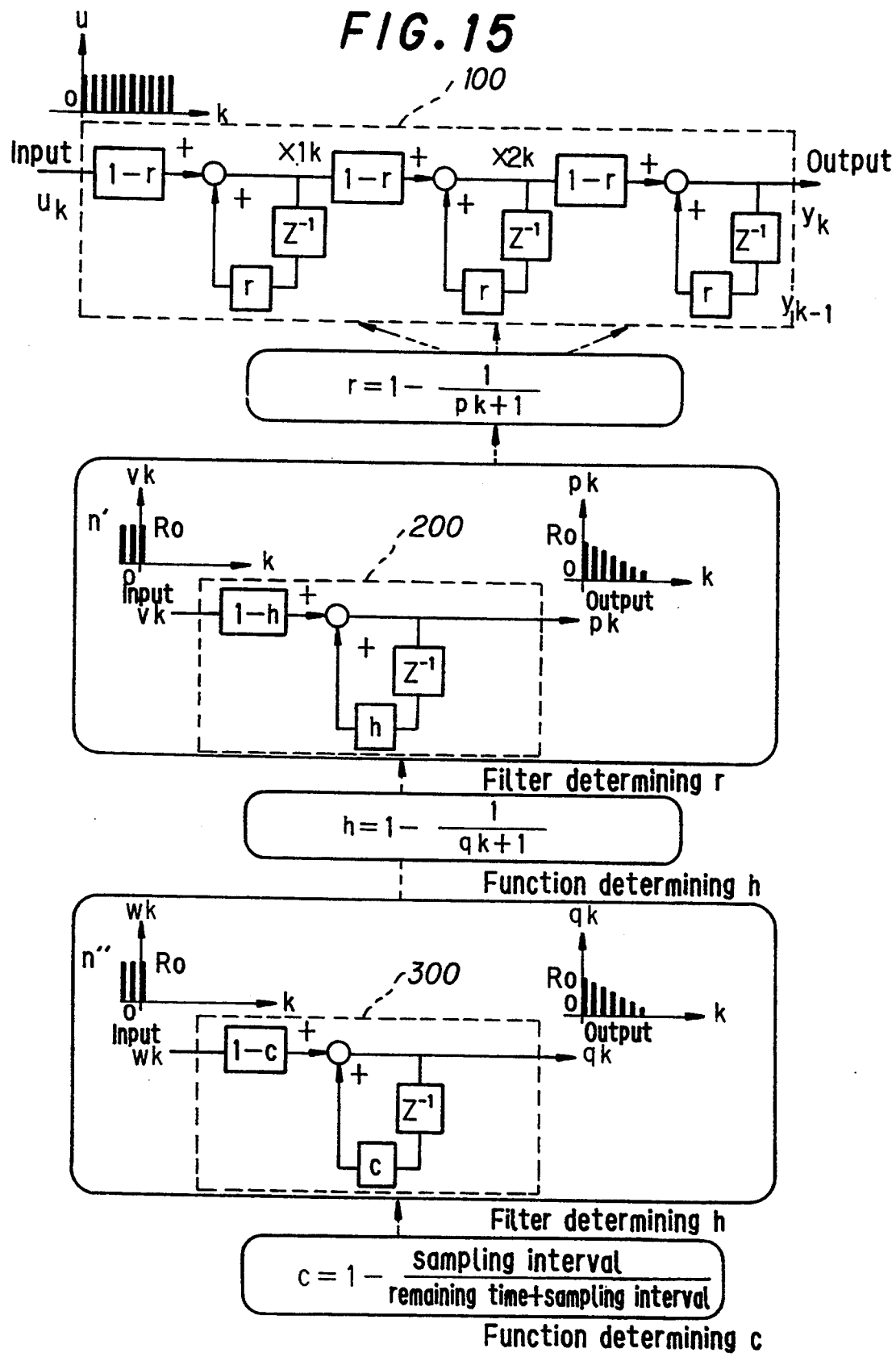
FIG. 15 is a block diagram showing a function generator according to a sixth embodiment of the invention.

FIG. 15 schematically illustrates a sixth embodiment of the invention, which is an improvement of the fifth embodiment realized by the addition of a third function generator 300. The third function generator 300 is input with a waveform wk (initial value n") and the three function generators are recursively coupled such that the pole of second function generator 200 is determined from the output qk of the third function generator 300. This embodiment enables the designated attainment time to be changed easily and arbitrarily while further enhancing the smoothness of the output waveform. From the explanation up to now, it will be understood that four or any other desired number of function generators can be coupled and that the larger is the number of coupled function generators, the smoother is the output waveform following time changes.

Figure 16:
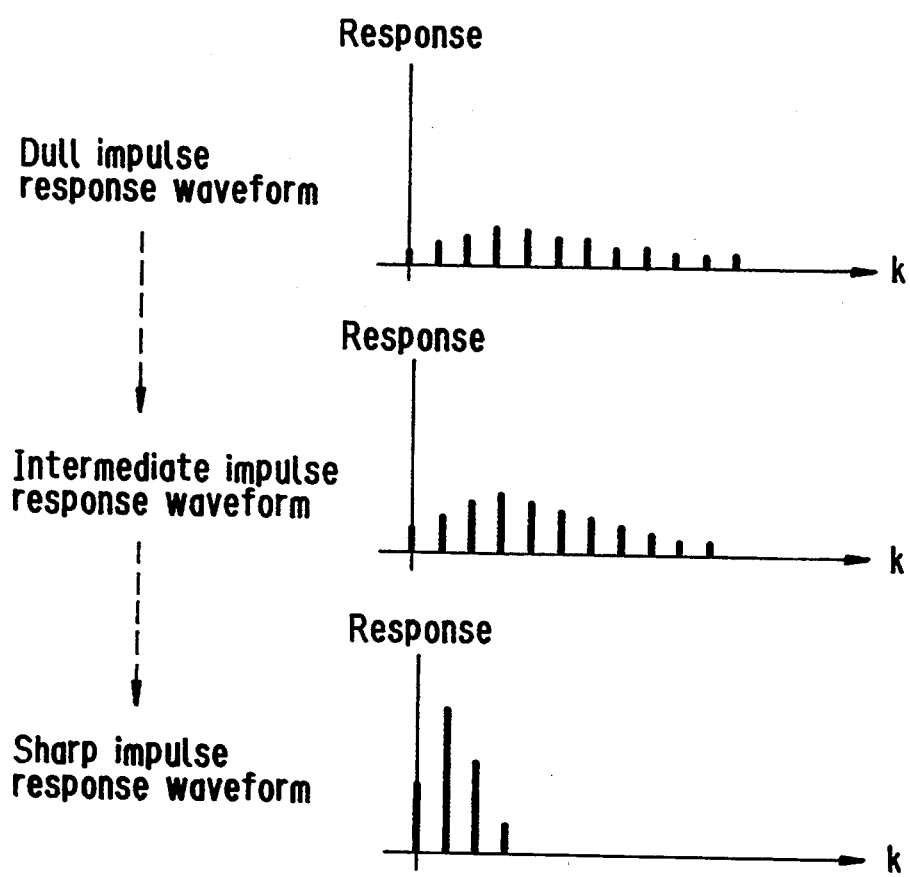
FIG. 16 is a waveform chart showing impulse responses to be used in a function generator according to a seventh embodiment of the invention.

FIG. 16 schematically illustrates a seventh embodiment of the invention using an FIR digital filter. An FIR digital filter is generally expressed as a difference equation like Eq. 8;

$$yk = \sum_{m=0}^{M} am * uk - m \qquad \text{Eq. 8}$$

In this embodiment, the upper limit frequency of the pass range of the filter is gradually raised by appropriately varying the coefficient am, thereby producing a waveform which smoothly attains the desired value at the designated attainment time. Once the filter frequency characteristics are fixed, the filter coefficient am satisfying the frequency characteristics can be obtained by well established digital filter design techniques (as described, for example, in "Digital Filter Design", by Masaaki Mitsuya, published by Shokodo, Tokyo, Japan.). This embodiment employs these techniques.

The coefficient am is the time series filter impulse response. Once the desired impulse response has been set, therefore, a coefficient which satisfies it can be designed with utmost ease. In the illustrated example, the filter characteristics are varied so as to gradually vary the impulse response waveform pattern. More specifically, a group of model impulse response waveforms differing stepwise are established. For example, a group of model impulse responses varied progressively such as somewhat dull impulse response waveform, a somewhat sharp impulse waveform, a sharp response impulse waveform etc. are established in advance as illustrated in FIG. 16. Each time the model impulse response waveform is changed, the coefficient am is redesigned to satisfy the new impulse response waveform. More specifically, starting at the initial time t0, the model impulse response waveform is progressively changed in the direction of increasing sharpness. The FIR digital filter is input with a ramp-shaped waveform that begins to change from the initial time T0 and attains the final desired value M steps before the designated attainment time. Here, M is the order of the FIR digital filter immediately before the designated attainment time. As a result, the output of the FIR digital filter is smooth and the final desired value is attained at the designated attainment time.

Alternatively, it is possible to establish a model low-pass filter and redesign the coefficient of the FIR filter to satisfy frequency characteristics of the low-pass filter each time the model low-pass filter is changed. In this case, the cut-off frequency of the model low-pass filter is gradually raised from the initial time t0, and the FIR digital filter is input with a ramp-shaped waveform that begins to change from the initial time T0 and attains the final desired value M steps before the designated attainment time. Here, M is the order of the FIR filter immediately before the designated attainment time as mentioned earlier. As a result, the output of the FIR digital filter is smooth and the final desired value is attained at the designated attainment time.

In the seventh embodiment, when the number of steps between the initial time and the designated time ((designated attainment time−initial time)/sampling interval)) is small, the order of the difference equation can be made small, so that the amount of computation is reduced. When the number of steps is large, however, the order of the difference equation has to be set high, with the result that the amount of computation becomes larger than in the first embodiment, for example. At the same time, however, there are fewer constraints on the waveform than in the other embodiments, so that it becomes possible to generate waveforms with a high degree of freedom. In addition, the amount of overshoot is small when the target value is changed before attainment. Specifically, since the computation is fundamentally a weighted averaging of past inputs, no output exceeding the input range is produced insofar as the weighting, i.e. all coefficients am, are non-negative.

Figure 17:
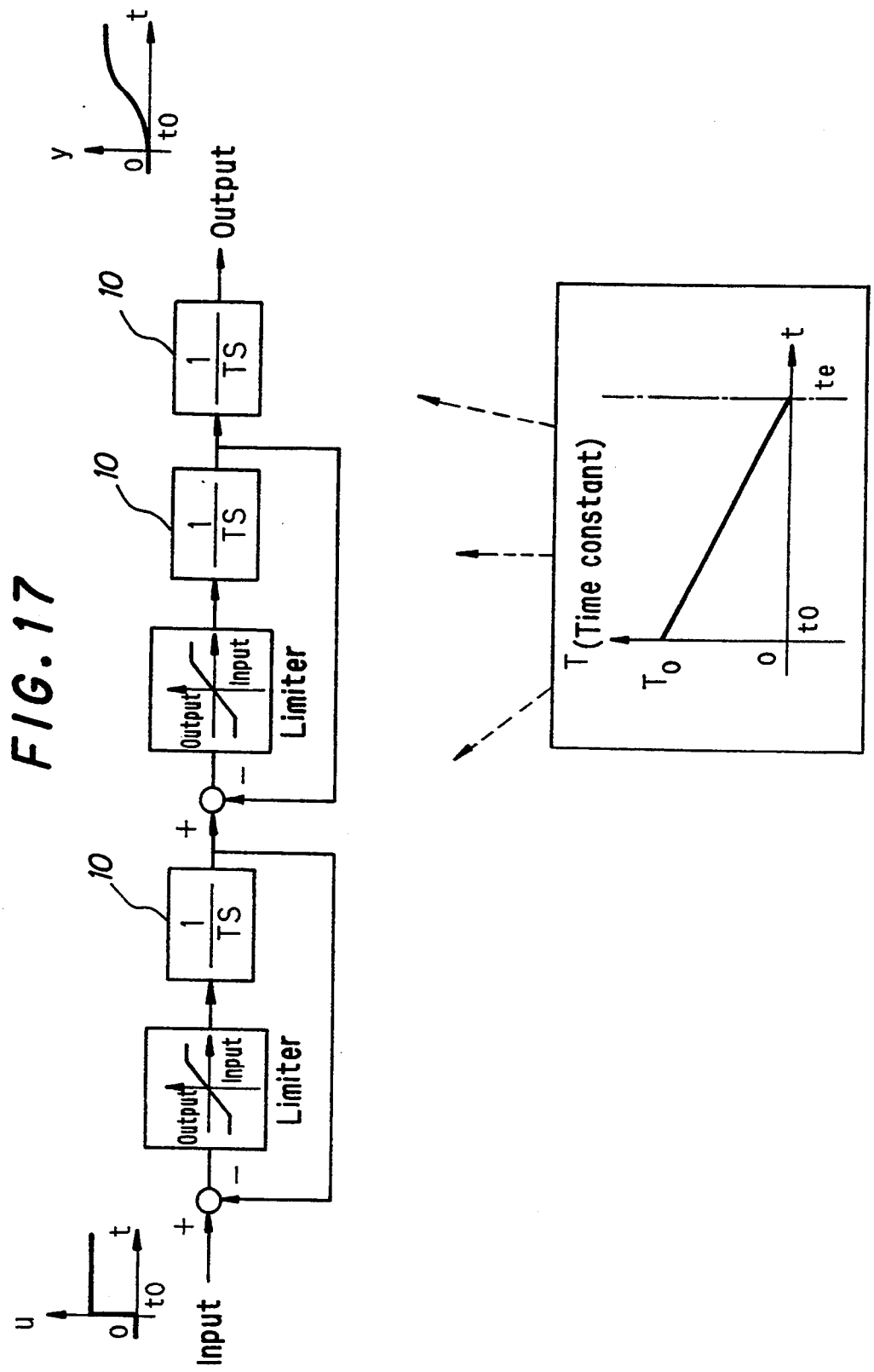
FIG. 17 is a block diagram showing a function generator according to an eighth embodiment of the invention.

FIG. 17 shows an eighth embodiment of the invention. This embodiment is similar to the fourth embodiment but additionally includes limiters for suppressing sudden changes in the output waveform. In this embodiment, unless the pole is set smaller overall than in the arrangement without limiters, the output is liable to settle abruptly to the desired value just before the designated attainment time. Limiters can also be added to the configuration according to the second embodiment.

Figure 18:
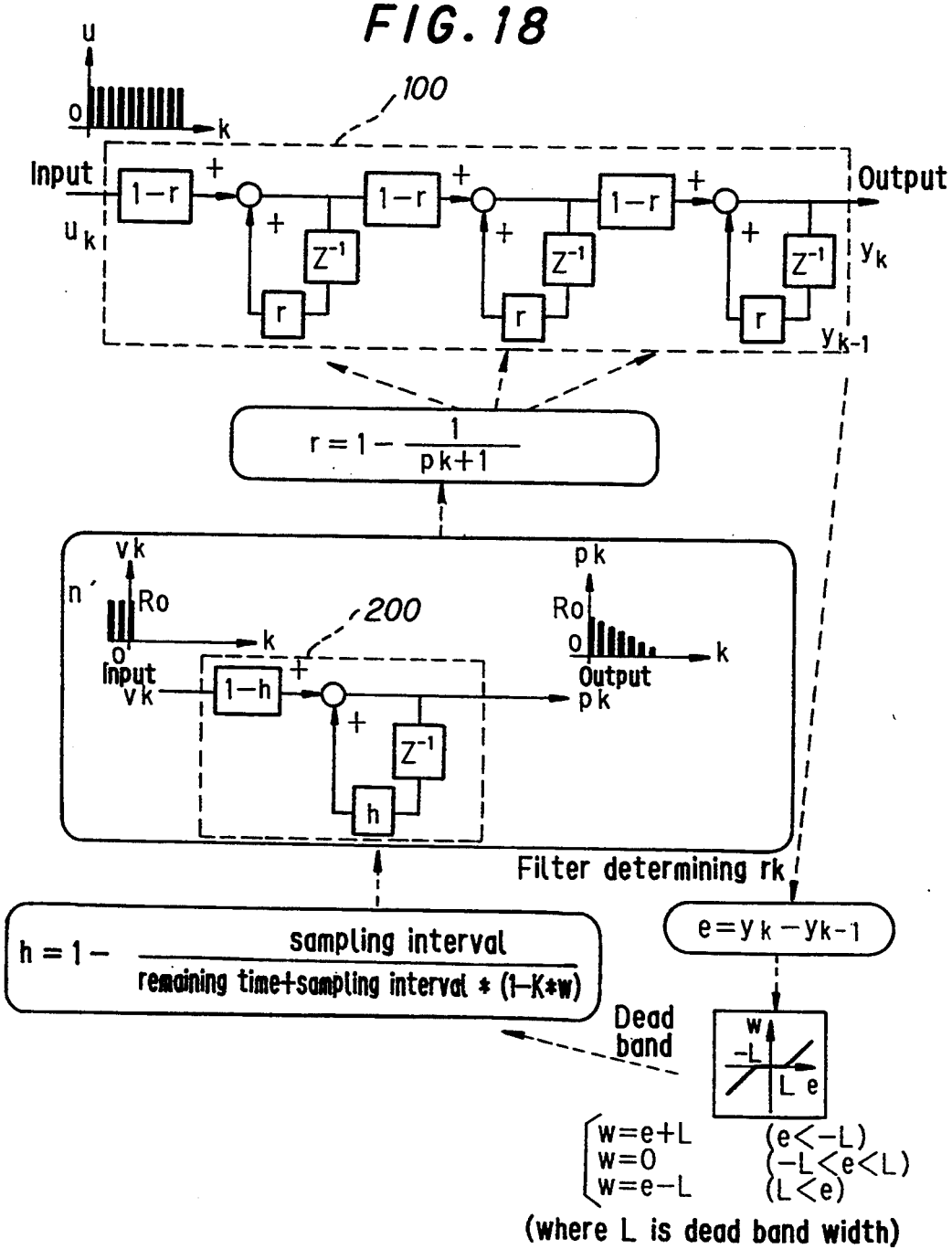
FIG. 18 is a block diagram showing a function generator according to a ninth embodiment of the invention.

FIG. 18 shows a ninth embodiment of the invention. In this embodiment, when the difference e of the output between yk and yk−1 exceeds a prescribed range (−L, L), h (the pole of the filter which generates poles r in accordance with the amount of the excess (the second function generator 200)), is modified so as to weaken the reduction rate of poles r and thus prevent abrupt changes in the difference value. In other words, the gradient of the value pk, in the second function generator 200 which determines r, is prevented from becoming too large, which is desirable because when this gradient becomes excessively large so does the variation in the first and second order differentials. This feature ensures that when the embodiment is applied to, for example, a joint control in a biped mobile robot as discussed next, the rotational velocity of the joint drive motors will not be exceeded. Since priority is given to the designated attainment time, however, cases may arise in which it is impossible to avoid an abrupt change in the differential values immediately before the designated attainment time. This is an example in which the difference value is fed back to the waveform generation system even though it is nonlinear.

Figure 19:
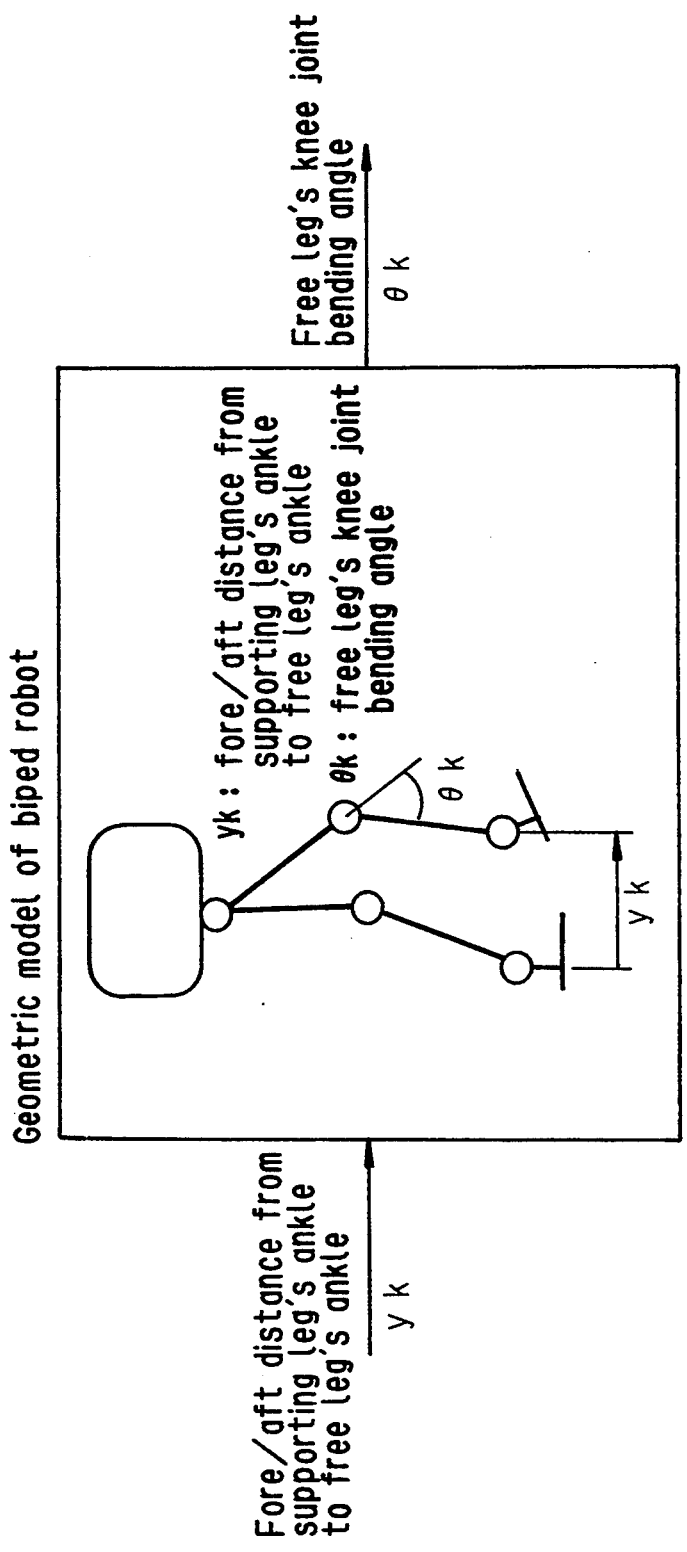
FIG. 19 is a view showing a tenth embodiment of the invention in which a function generator is used to generate a free leg's trajectory of a biped mobile robot.

FIG. 19 shows a tenth embodiment of the present invention applied for a free leg's trajectory generation in a biped mobile robot. As shown in this figure, it is the general practice in biped mobile robot control first to determine the displacement pattern of the leg's extremities (foot) and then to compute the joint angles by inverse kinematic calculation. In this case, even if the acceleration/deceleration of the foot's displacement pattern itself has a gentle waveform, there is a tendency for inordinately large angular velocities and angular accelerations to be produced in the joints when the attitude of the robot is such that the joints are extended nearly to the limit. This embodiment eliminates this problem.

Figure 20:
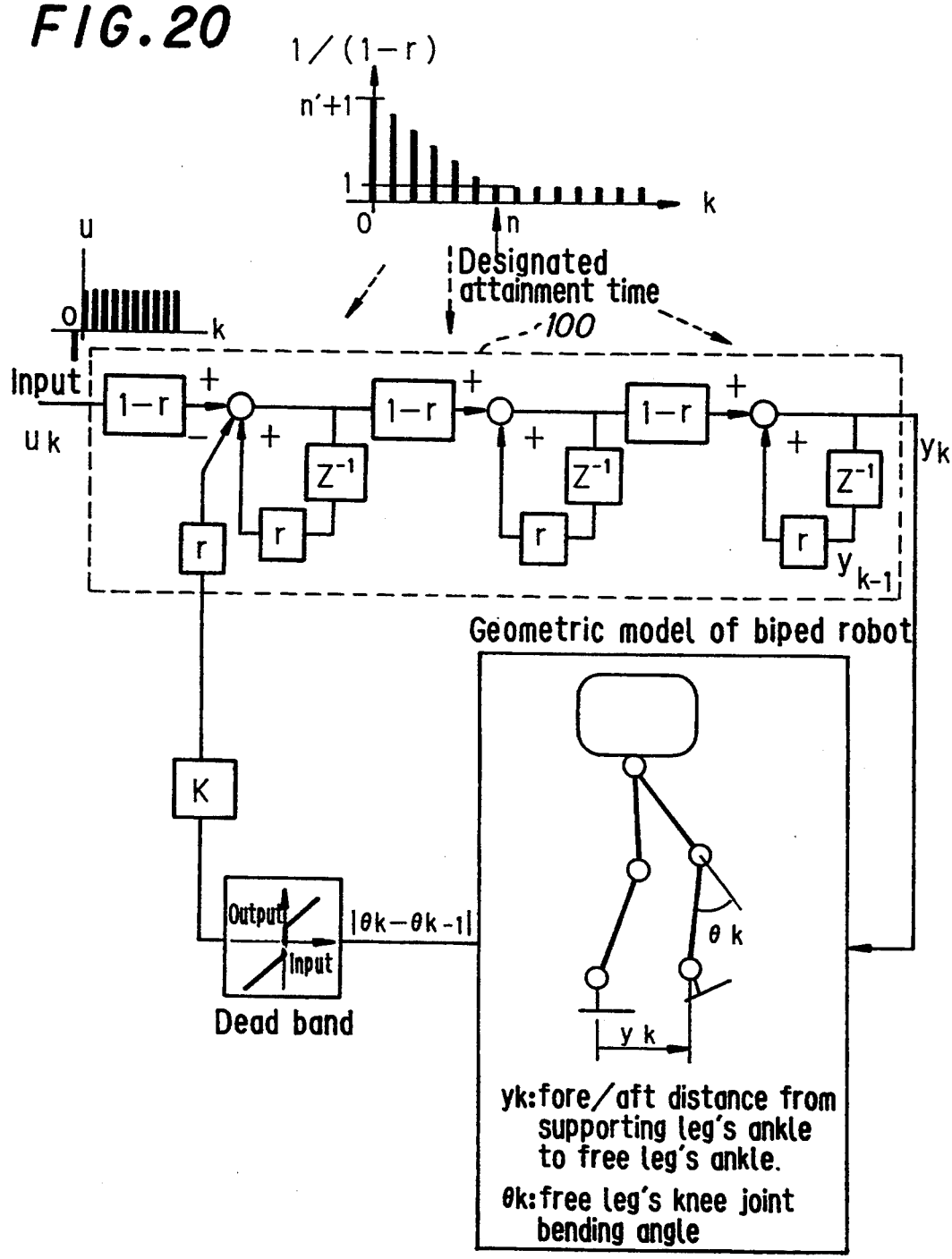
FIG. 20 is a view, similar to FIG. 19, but showing an eleventh embodiment of the invention in which a function generator is also used to generate a free leg's trajectory of a biped mobile robot.

FIG. 20 shows an eleventh embodiment of the invention which is also applied for a free leg's trajectory generation in a biped mobile robot. This embodiment prevents inordinate joint angular velocities by feeding back the absolute value of the knee joint angular velocity in the third embodiment. Although it is similar to the ninth and tenth embodiments, it must be noted that even though the function generator according to this invention produces a smooth output, in the case where it is applied to a legged mobile robot, the desired smoothness of, for example, the displacement acceleration may not be obtained owing to the fact that a legged mobile robot is structurally nonlinear. In this embodiment, therefore, the concept of the tenth embodiment is further developed by feeding back the absolute value of the joint angular velocity. Specifically, as shown in FIG. 20, the value obtained by multiplying the absolute value of the joint angular velocity imparted with dead band characteristics by a gain K and poles r is added to the state variable of the function generator 100. Since priority is given to the designated attainment time, the feedback control input falls to near zero in the vicinity of this time. Thus, as in the tenth embodiment, cases may arise in which the change in the angular velocity remains large.

As is clear from the foregoing, each of the embodiments can have various types of inputs, including an input which immediately changes from the initial time to the final desired value, an input which changes in a ramp-like pattern from an initial value to the final desired value, an input which changes stepwise from an initial value to an intermediate desired value and, after a prescribed time period, changes stepwise to the final desired value, an input which changes so as to once exceed the final desired value, a broken line input, an impulse wave input, etc.

The fifth and sixth embodiments are obtained by adding second and third function generators. Similarly, it is also possible to add second and third function generators to the second and fourth embodiments, thus enabling the time constant T itself to be decided. In other words, a waveform whose initial value is T0 and whose final desired value is about 0 can be input to the second and third function generators and the output be used as the time constant T.

In addition, the application of the invention to the generation of the free leg trajectory of a biped mobile robot is only one example and the invention can also be applied to the generation of the trajectories of other mobile units such as automatic vehicles or to the generation of the trajectories of the manipulators of stationary industrial robots.

Moreover, the present invention has thus been shown and described with reference to the specific embodiments. However, it should be noted that the invention is in no way limited to the details of the described arrangements, changes and modifications may be made without departing from the scope of the appended claims.

What is claimed is:

1. A function generator comprising:
   first means for producing an output which is a specific function of its input, and
   second means for varying characteristics of said first means according to a remaining time up to a desired time such that the output substantially reaches a desired value.

2. A function generator according to claim 1, further including a low-pass filter, and said second means raises the cutoff frequency of the filter according to the remaining time.

3. A function generator according to claim 2, further including a limiter for suppressing rapid change in the output of the function generator.

4. A function generator according to claim 1, further including a filter, and said second means varies the location of at least one pole on a complex number plane or a z-plane of a transfer function describing the characteristics of the filter.

5. A function generator according to claim 3, wherein the filter is an IIR filter, and said second means gradually brings all poles on a z-plane of a transfer function describing the characteristics of the filter to zero such that the all poles disappear immediately before the arrival at the desired time.

6. A function generator according to claim 5, further including a second function generator, and said second means varies the pole location in response to an output of the second function generator.

7. A function generator according to claim 6, further including a function generator up to n+1-th (where: n≧2) one and third means for varying the characteristics of the function generator up to the n+1-th one, and said third means varies the pole location of a transfer function describing the characteristics of the n-th function generator in response to an output of the n+1-th function generator.

8. A function generator according to claim 7, further including a function generator up to m-th (where: m>1) one coupled in series.

9. A function generator according to claim 8, further including a limiter for suppressing rapid change in the output of the function generator.

10. A function generator according to claim 7, further including a limiter for suppressing rapid change in the output of the function generator.

11. A function generator according to claim 6, further including a function generator up to m-th (where: m>1) one coupled in series.

12. A function generator according to claim 11, further including a limiter for suppressing rapid change in the output of the function generator.

13. A function generator according to claim 6, further including a limiter for suppressing rapid change in the output of the function generator.

14. A function generator according to claim 5, further including a function generator up to m-th (where: m>1) one coupled in series.

15. A function generator according to claim 14, further including a limiter for suppressing rapid change in the output of the function generator.

16. A function generator according to claim 5, further including a limiter for suppressing rapid change in the output of the function generator.

17. A function generator according to claim 4, further including a second function generator, and said second means varies the pole location in response to an output of the second function generator.

18. A function generator according to claim 17, further including a function generator up to n+1-th (where: n≧2) one and third means for varying the characteristics of the function generator up to the n+1-th one, and said third means varies the pole location of a transfer function describing the characteristics of the n−th function generator in response to an output of the n+1-th function generator.

19. A function generator according to claim 18, further including a function generator up to m—-th (where: m>1) one coupled in series.

20. A function generator according to claim 19, further including a limiter for suppressing rapid change in the output of the function generator.

21. A function generator according to claim 18, further including a limiter for suppressing rapid change in the output of the function generator.

22. A function generator according to claim 17, further including a function generator up to m-th (where: m>1) one coupled in series.

23. A function generator according to claim 22, further including a limiter for suppressing rapid change in the output of the function generator.

24. A function generator according to claim 17, further including a limiter for suppressing rapid change in the output of the function generator.

25. A function generator according to claim 4, further including a function generator up to m-th (where: m>1) one coupled in series.

26. A function generator according to claim 25, further including a limiter for suppressing rapid change in the output of the function generator.

27. A function generator according to claim 4, further including a limiter for suppressing rapid change in the output of the function generator.

28. A function generator according to claim 1, further including an IIR digital filter, and said second means gradually brings all poles on a z-plane of a transfer function describing the characteristics of the filter to zero such that the all poles disappear immediately before arrival at the desired time.

29. A function generator according to claim 28, further including a second function generator, and said second means varies the pole location in response to an output of the second function generator.

30. A function generator according to claim 29, further including a function generator up to n+1-th (where: n≧2) one and third means for varying the characteristics of the function generator up to n+1-th one, and said third means varies the pole location of a transfer function describing the characteristics of the n-th function generator in response to an output of the n+1-th function generator.

31. A function generator according to claim 30, further including a function generator up to m-th (where: m>1) one coupled in series.

32. A function generator according to claim 31, further including a limiter for suppressing sudden change in the output of the function generator.

33. A function generator according to claim 30, further including a limiter for suppressing rapid change in the output of the function generator.

34. A function generator according to claim 29, further including a function generator up to m-th (where: m>1) one coupled in series.

35. A function generator according to claim 34, further including a limiter for suppressing rapid change in the output of the function generator.

36. A function generator according to claim 29, further including a limiter for suppressing rapid change in the output of the function generator.

37. A function generator according to claim 28, further including a function generator up to m-th (where: m>1) one coupled in series.

38. A function generator according to claim 37, further including a limiter for suppressing rapid change in the output of the function generator.

39. A function generator according to claim 28, further including a limiter for suppressing rapid change in the output of the function generator.

40. A function generator according to claim 1, further including a function generator up to m-th (where: m>1) one coupled in series.

41. A function generator according to claim 40, further including a limiter for suppressing rapid change in the output of the function generator.

42. A function generator according to claim 1, further including a limiter for suppressing rapid change in the output of the function generator.

43. A function generator according to claim 1, wherein said second means varies the characteristics of the function generator according to state variables of a control object which is provided with the function generator's output.

44. A function generator according to claim 43, wherein the desired value is a displacement or displacement velocity of a link of a linkage mechanism, and said second means varies the pole location in response to a value proportional to a n-th difference of the link's displacement.

45. A function generator according to claim 43, wherein the desired value is a displacement or displacement velocity of a link of a linkage mechanism, and said second means varies the characteristics or state variables of a state equation describing the operation of the function generator in response to a value proportional to a n-th difference of the link's displacement.

46. A function generator according to claim 43, wherein the desired value is a displacement or displacement velocity of links of a linkage mechanism, and said second means varies the characteristics or state variables of a state equation describing the operation of the function generator in response to a glue proportional to a n-th difference of one link's displacement.

* * * * *